United States Patent
Subbaraman et al.

(10) Patent No.: US 10,672,927 B2
(45) Date of Patent: Jun. 2, 2020

(54) PHOTOVOLTAIC CELL HAVING A COUPLED EXPANDED METAL ARTICLE

(71) Applicant: Merlin Solar Technologies, Inc., San Jose, CA (US)

(72) Inventors: Venkateswaran Subbaraman, San Jose, CA (US); Gopal Prabhu, San Jose, CA (US); Venkatesan Murali, Los Gatos, CA (US); David Tanner, San Jose, CA (US)

(73) Assignee: Merlin Solar Technologies, Inc., San Jose, CA (US)

(*) Notice: Subject to any disclaimer, the term of this patent is extended or adjusted under 35 U.S.C. 154(b) by 0 days.

(21) Appl. No.: 16/238,525

(22) Filed: Jan. 3, 2019

(65) Prior Publication Data
US 2019/0140125 A1 May 9, 2019

Related U.S. Application Data

(63) Continuation-in-part of application No. 15/382,304, filed on Dec. 16, 2016, now Pat. No. 10,181,542, (Continued)

(51) Int. Cl.
*H01L 31/044* (2014.01)
*H01L 31/05* (2014.01)
*H01L 31/0465* (2014.01)
*H02S 40/34* (2014.01)
*H01L 31/0224* (2006.01)
*C25B 11/03* (2006.01)

(52) U.S. Cl.
CPC ........ *H01L 31/0508* (2013.01); *C25B 11/03* (2013.01); *H01L 31/022425* (2013.01); (Continued)

(58) Field of Classification Search
CPC .............. H01L 31/00–078; Y02E 10/50–60
(Continued)

(56) References Cited

U.S. PATENT DOCUMENTS 6,359,209 B1 * 3/2002 Glenn ................ H01L 31/0508
136/244
8,569,096 B1 10/2013 Babayan et al.
(Continued)

FOREIGN PATENT DOCUMENTS

JP 2006165149 A 6/2006
JP 2007201265 A 8/2007
(Continued)

OTHER PUBLICATIONS

Office Action dated Apr. 16, 2019 for Japanese Patent Application No. 2016-574092.
(Continued)

*Primary Examiner* — Bach T Dinh
(74) *Attorney, Agent, or Firm* — MLO, a professional corp.

(57) ABSTRACT

Methods include providing an expanded metal article configured as a mesh. The expanded metal article has a plurality of cuts in the mesh and has a surface comprising a plurality of solder pads. A semiconductor material is provided, having a back surface comprising a plurality of silver pads. A front surface of the semiconductor material serves as a light-incident surface of the photovoltaic cell. A front metallic article is provided, the front metallic article comprising a plurality of electroformed elements interconnected to form a unitary, free-standing piece comprising a continuous grid. The continuous grid of the front metallic article is electrically coupled with the front surface of the semiconductor material. The plurality of cuts of the expanded metal article is arranged to relieve stresses induced by the front metallic article on the front surface of the semiconductor material.

14 Claims, 11 Drawing Sheets

Related U.S. Application Data which is a continuation-in-part of application No. PCT/US2015/032622, filed on May 27, 2015.

(60) Provisional application No. 62/014,950, filed on Jun. 20, 2014.

(51) Int. Cl.
(52) U.S. Cl.
CPC .. *H01L 31/022433* (2013.01); *H01L 31/0465* (2014.12); *H02S 40/34* (2014.12)

(58) Field of Classification Search
USPC .................................................. 136/243–265
See application file for complete search history.

(56) References Cited

U.S. PATENT DOCUMENTS

| | | |
|---|---|---|
| 2008/0149161 A1 | 6/2008 | Nishida et al. |
| 2010/0116323 A1 | 5/2010 | Katayama et al. |
| 2010/0229917 A1 | 9/2010 | Choi et al. |
| 2012/0204928 A1 | 8/2012 | Kutzer et al. |
| 2014/0352777 A1* | 12/2014 | Hachtmann ............ H01L 31/18 136/256 |
| 2016/0268963 A1* | 9/2016 | Tsai ................... H01L 31/0443 |

FOREIGN PATENT DOCUMENTS

| | | |
|---|---|---|
| JP | 2008159895 A | 7/2008 |
| JP | 2011077362 A | 4/2011 |
| KR | 1020120131277 A | 12/2012 |
| WO | 201306233 A1 | 6/2013 |

OTHER PUBLICATIONS

International Search Report and Written Opinion dated Sep. 4, 2015 for PCT Patent Application No. PCT/US2015/032622.
Notice of Allowance dated Sep. 17, 2018 for U.S. Appl. No. 15/382,304.
Office Action dated May 16, 2018 for U.S. Appl. No. 15/382,304.

* cited by examiner

PHOTOVOLTAIC CELL HAVING A COUPLED EXPANDED METAL ARTICLE

RELATED APPLICATIONS

This application is a continuation-in-part of U.S. patent application Ser. No. 15/382,304, filed on Dec. 16, 2016 and entitled "Photovoltaic Cell Having a Coupled Expanded Metal Article"; which is a continuation-in-part of International PCT Application No. PCT/US15/32622, filed on May 27, 2015 and entitled "Photovoltaic Cell Having a Coupled Expanded Metal Article"; which claims priority to U.S. Provisional Patent Application No. 62/014,950, filed on Jun. 20, 2014 and entitled "Photovoltaic Cell Having a Coupled Expanded Metal Article"; all of which are hereby incorporated by reference for all purposes.

BACKGROUND

A solar cell is a device that converts photons into electrical energy. The electrical energy produced by the cell is collected through electrical contacts coupled to the semiconductor material, and is routed through interconnections with other photovoltaic cells in a module. The "standard cell" model of a solar cell has a semiconductor material, used to absorb the incoming solar energy and convert it to electrical energy, placed below an anti-reflective coating (ARC) layer, and above a metal backsheet. Electrical contact is typically made to the semiconductor surface with fire-through paste, which is metal paste that is heated such that the paste diffuses through the ARC layer and contacts the surface of the cell. The paste is generally patterned into a set of fingers and bus bars which will then be soldered with ribbon to other cells to create a module. Another type of solar cell has a semiconductor material sandwiched between transparent conductive oxide layers (TCO's), which are then coated with a final layer of conductive paste that is also configured in a finger/bus bar pattern.

In both these types of cells, the metal paste, which is typically silver, works to enable current flow in the horizontal direction (parallel to the cell surface), allowing connections between the solar cells to be made towards the creation of a module. Solar cell metallization is most commonly done by screen printing a silver paste onto the cell, curing the paste, and then soldering ribbon across the screen printed bus bars. However, silver is expensive relative to other components of a solar cell, and can contribute a high percentage of the overall cost.

To reduce silver cost, alternate methods for metallizing solar cells are known in the art. For example, attempts have been made to replace silver with copper, by plating copper directly onto the solar cell. However, a drawback of copper plating is contamination of the cell with copper, which impacts reliability. Plating throughput and yield can also be issues when directly plating onto the cell due to the many steps required for plating, such as depositing seed layers, applying masks, and etching or laser scribing away plated areas to form the desired patterns. Other methods for forming electrical conduits on solar cells include utilizing arrangements of parallel wires or polymeric sheets encasing electrically conductive wires, and laying them onto a cell. However, the use of wire grids presents issues such as undesirable manufacturing costs and high series resistance.

Furthermore, in Babayan et al., U.S. Pat. Nos. 8,569,096 and 8,936,709, which are owned by the assignee of the present application and are incorporated in their entirety by reference herein, electrical conduits for semiconductors such as photovoltaic cells are fabricated as an electroformed free-standing metallic article which are subsequently attached to a semiconductor material. The metallic articles are produced separately from a solar cell and can include multiple elements such as fingers and bus bars that can be transferred stably as a unitary piece and easily aligned to a semiconductor device. The elements of the metallic article are formed integrally with each other in the electroforming process. However, the metallic article is manufactured in an electroforming mandrel, which, while generating a patterned metal layer that is tailored for a solar cell or other semiconductor device, requires additional equipment and cost.

Therefore, there is a need in the industry for low cost methods for attaching electrically conductive elements to the surface of a semiconductor material to thereby form a photovoltaic cell.

SUMMARY

In some embodiments, methods include providing an expanded metal article configured as a mesh, the mesh comprising a plurality of first segments intersecting a plurality of second segments thereby forming a plurality of openings. The expanded metal article has a plurality of cuts in the mesh and has a surface comprising a plurality of solder pads. A semiconductor material is provided, the semiconductor material having a back surface comprising a plurality of silver pads. A front surface of the semiconductor material serves as a light-incident surface of the photovoltaic cell. The method also includes electrically coupling, at a plurality of soldering locations, a majority of the plurality of solder pads on the surface of the expanded metal article with the plurality of silver pads on the back surface of the semiconductor material. A front metallic article is provided, the front metallic article comprising a plurality of electroformed elements interconnected to form a unitary, free-standing piece comprising a continuous grid. The continuous grid of the front metallic article is electrically coupled with the front surface of the semiconductor material. The plurality of cuts of the expanded metal article is arranged to relieve stresses induced by the front metallic article on the front surface of the semiconductor material.

It is to be understood that both the foregoing general description and the following detailed description are exemplary and explanatory only and are intended to provide further explanation of the present invention, as claimed.

BRIEF DESCRIPTION OF THE DRAWINGS

Each of the aspects and embodiments described herein can be used alone or in combination with one another. The aspects and embodiments will now be described with reference to the attached drawings.

Figure 1:
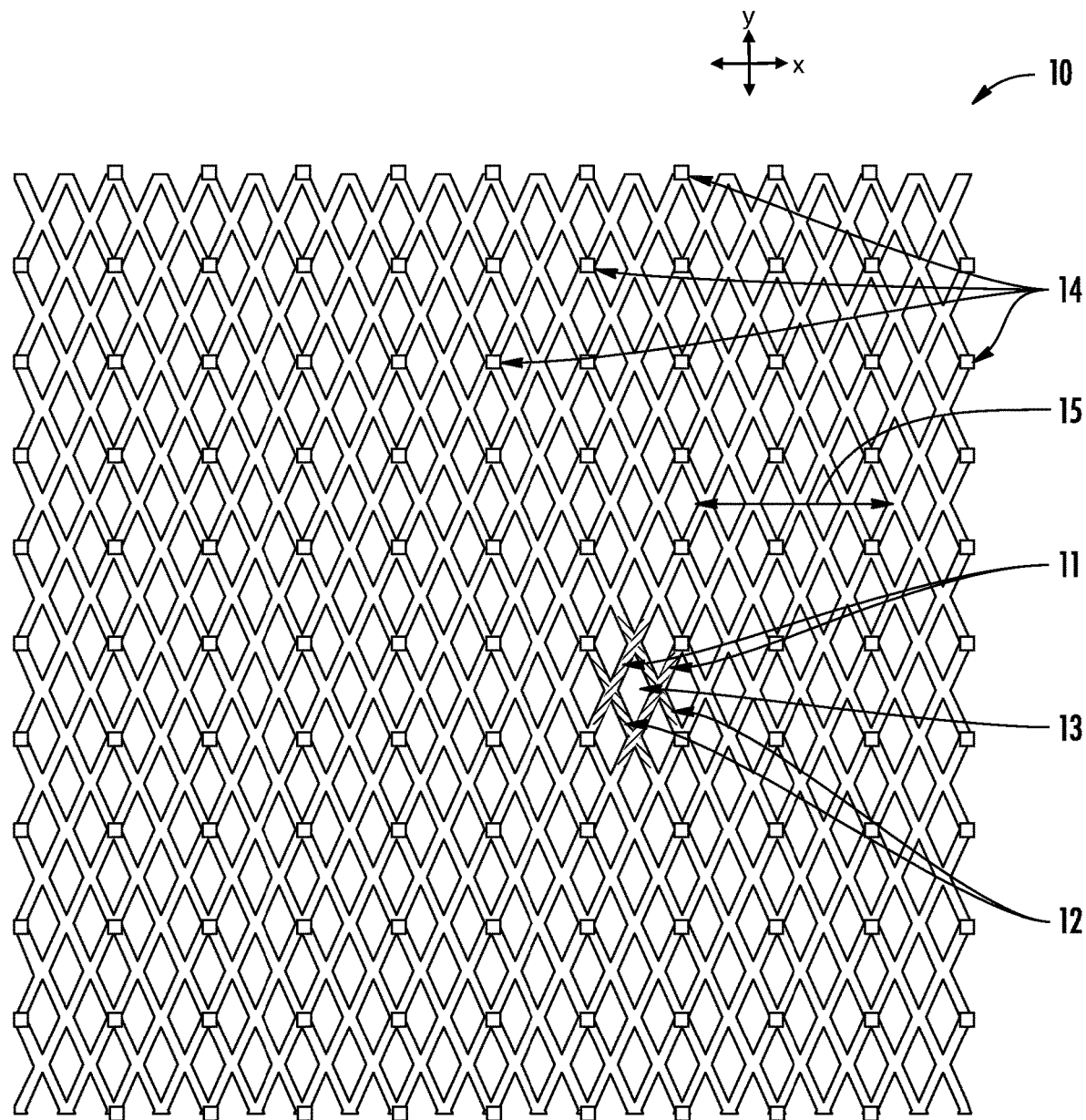
FIG. 1 shows an embodiment of an expanded metal article used to form a photovoltaic cell, in accordance with some embodiments.

It should be understood that the above-referenced drawings are not necessarily to scale, presenting a somewhat simplified representation of various features illustrative of the basic principles of the disclosure. The specific design features of the present disclosure, including, for example, specific dimensions, orientations, locations, and shapes, will be determined in part by the particular intended application and use environment.

DETAILED DESCRIPTION

The present disclosure relates to photovoltaic cells comprising attached expanded metal articles. The expanded metal articles are configured as a mesh and have cuts in the mesh, where the expanded metal articles are arranged on photovoltaic cells such that the cuts relieve thermal and mechanical stresses of the assembled photovoltaic cell.

According to some embodiments, the method comprises the step of providing an expanded metal article, providing a semiconductor material, and electrically coupling them. The term "expanded metal article" refers to metallic articles prepared by a known process in which metal in the form of a sheet or plate is simultaneously slit and stretched (i.e., expanded) in defined patterns to produce a metallic article having a continuous mesh or grid-like structure. While similar grid patterns can also be formed in metallic sheets by stamping operations, these methods produce a significant amount of waste material. By comparison, the expanded metal process disclosed herein essentially produces a metallic article having specifically designed openings or holes without removing any material to produce them. The resulting expanded metal can be taken up in rolls and subsequently cut into specific sized free-standing pieces for various applications.

The expanded metal article used in the present methods can comprise any metal, for instance a conductive metal, that can be formed into a grid using the expanded metal process. For example, the expanded metal article may comprise nickel, copper, aluminum, silver, palladium, platinum, titanium, or galvanized or stainless steel. Alloys of these metals can also be used. In some embodiments, the expanded metal article comprises copper, and is a copper grid.

The expanded metal article comprises a plurality of first segments intersecting a plurality of second segments forming an opening, and the shape of the opening is not particularly limited. For example, the openings in the article can be diamond shaped, square, hexagonal, ovoid (having an shape similar to an egg or oval), or circular. These shapes may also be elongated, depending on the directionality of the process by which the openings are formed and expanded. Also, irregular shapes are also possible, depending, for example, on how the slit in the starting metallic sheet is created and expanded. The size of the opening and the size of the first and second elements can also vary, depending, for example, on which side of the semiconductor material the expanded metal article is to be electrically coupled, described in more detail below. For example, the opening can have a dimension (such as a length or a width) of from about 2 mm to about 20 mm. As a specific example, the expanded metal article can comprise diamond shaped openings having a width of from about 2 mm to about 10 mm, such as about 3 mm to about 7 mm, and a length of from about 5 mm to about 20 mm, such as about 10 mm to about 15 mm. Furthermore, the first and second segments can have a width of from about 0.5 mm to about 10 mm, including from about 1 mm to about 5 mm. Thinner segments can also be used, as long as the expanded metallic article remains as a continuous grid during handling.

The thickness of the expanded metal article can also vary depending on, for example, cost, handling characteristics, the thickness of the metallic sheet from which it was made, as well as the desired electrical current carrying needs of the resulting photovoltaic cell. For example, the expanded metal article can have a thickness of from about 25 microns to about 300 microns, including from about 50 microns to about 200 microns and from about 75 microns to about 150 microns. Thinner expanded metal articles can be used for highly conductive metals without sacrificing photovoltaic performance, while relatively thicker articles can be used for metals with poorer mechanical strength but lower cost (including processing costs).

In some embodiments, the expanded metal article further comprises a plurality of soldering points which are configured to enable the metal article to be electrically coupled to a semiconductor material to form a photovoltaic cell. The soldering points can be located at various positions on either the top or bottom surface of the expanded metal article and can comprise any soldering material known in the art. For example, the soldering points may be solder pads having, for example, square, rectangular, or round shapes, and these pads can be positioned on the intersecting first and second elements or at the intersection of these elements. Alternatively, or in addition, the soldering points comprise areas of higher amounts of solder compared to the rest of the surface of the expanded metal article. For example, the surface of an expanded copper metal article to be coupled to the semiconductor material may be coated by a layer of solder having a thickness of from about 1 to about 10 microns, such as from 2 to about 5 microns, which can be used, for example, to help prevent copper electromigration, and further may include a plurality of locations comprising solder having a thickness of from about 15 to about 30 microns, such as from about 20 to about 25 microns. In an example embodiment, the expanded metal article may be coated with an initial layer of solder coating, such as by electroplating. The solder coating may have a thickness of, for example, from about 1 to about 10 microns, or from 2 to about 5 microns. Additional solder may then be applied onto the solder coating to prepare for soldering which electrically couples the expanded metal article to the semiconductor material. The additionally applied solder may be supplied from, for example, a solder ribbon or a solder paste that can be applied during any point in the assembly process. For example, the applied solder can be solder pads that are formed on the expanded metal article prior to placing the metal article onto the semiconductor material. Alternatively, the solder pads created by the applied solder can be added during or after the placement of the expanded metal article onto the semiconductor material. For any of these soldering embodiments, flux may also be applied during the soldering process according to standard techniques.

A specific example of an embodiment of the expanded metal article used in the present methods is shown in FIG. 1. It should be apparent to those skilled in the art that the figures presented are merely illustrative in nature and not limiting, being presented by way of example only. Numerous modifications and other embodiments are within the scope of one of ordinary skill in the art, given the benefit of the present disclosure, and are contemplated as falling within the scope of the present disclosure. In addition, those skilled in the art should appreciate that the specific configurations are exemplary and that actual configurations will depend on the specific system. Those skilled in the art will also be able to recognize and identify equivalents to the specific elements shown, using no more than routine experimentation.

As shown in FIG. 1, expanded metal article 10 comprises a plurality of first elements 11 intersecting a plurality of second elements 12, forming a continuous grid or mesh structure having a plurality of openings 13, which, in this example, are diamond shaped. The openings 13 can be made by making slits in a piece of sheet metal and stretching the sheet metal so that the sheet metal is expanded at the slits. For example, in FIG. 1 if slits are made in the vertical direction (y-direction) then the sheet metal is stretched (i.e., expanded) in the horizontal direction (x-direction) as indicated by arrow 15 representing the expansion direction. In FIG. 1, the long way of the openings 13 is in the vertical direction, and the short way of the openings 13 is in the horizontal direction which is also the expansion direction in this embodiment. The long way of the openings 13 is the length of the long diamond diagonal, while the short way of the openings 13 is the length of the short diamond diagonal. Expanded metal article 10 further comprises a plurality of solder pads 14, which, as shown, are positioned around the surface of expanded metal article 10 at intersection points on the periphery of the surface as well as in interior locations.

As described above, methods of the present disclosure comprise electrically coupling or attaching the expanded metal article to a semiconductor material, such as amorphous silicon, crystalline silicon (including multicrystalline and monocrystalline silicon), or any other semiconductor material suitable for use in a photovoltaic cell. The semiconductor material can vary in size and shape and can comprise, for example, a square multicrystalline silicon cell or a monocrystalline silicon cell having rounded corners, sometimes referred to as a pseudosquare shape. Others will be known in the art.

The semiconductor material has a top (i.e., front) surface, which is the light incident surface of the photovoltaic cell to be formed, and a bottom (i.e., back) surface, which is the opposite side of the cell not exposed to light, and the expanded metal article can be electrically coupled to either surface. While the coupling can occur anywhere on the surfaces of either the expanded metal article or the semiconductor material, in some embodiments the metallic article and semiconductor material coincide, with the expanded metal article substantially spanning a surface, such as the top or bottom surface, of the semiconductor material. However, it is also possible for the expanded metal article to extend beyond the semiconductor surface, thereby forming an interconnection element that can be used to connect multiple photovoltaic cells together to form a module. At least one surface of the semiconductor material comprises a plurality of points of contact for the expanded metal article. In some embodiments, a majority of the soldering points on the surface of the expanded metal article are electrically coupled and, as such, are in electrical contact with, the plurality of points of contact on the semiconductor material. That is, the majority of the plurality of solder pads on the surface of the expanded metal article are electrically coupled at a plurality of soldering locations with the plurality of silver pads on the surface of the semiconductor material.

The points of contact on the surface of the semiconductor material will depend, for example, on which surface the metallic article is coupled. In one embodiment, the top surface of the semiconductor material comprises a plurality of silver segments, and the expanded metal article is coupled to these segments. The plurality of silver segments can be, for example, a linear array of parallel silver fingers traversing the top surface of the semiconductor material from one edge to an opposite edge. Such an arrangement is common and well known in photovoltaic cells. Alternatively, the silver segments can be linear segments of silver arranged linearly across the semiconductor surface, forming, for example, broken parallel silver lines or fingers traversing from one edge of the surface to an opposite edge. Other arrangements are also possible and will be known to one skilled in the art.

For this embodiment, since the top surface will be exposed to light, it is important that the expanded metal article have opening sizes and segment widths that minimize shading to the semiconductor surface and thus has a high percent open area (which is the percentage of the semiconductor material not shaded by the metallic article). The resulting photovoltaic cell of this embodiment has a percent open area greater than about 90%, such as greater than about 93%, or such as greater than about 95%.

In another embodiment of the present methods, the expanded metal article is electrically coupled to the bottom (back) surface of the semiconductor material, which comprises a plurality of silver pads as the points of contact. The silver pads can be any shape, such as, for example, square, rectangular, or round, and may be the same or different in size and/or shape than the solder pads on the surface of the expanded metal article. The silver pads can be positioned anywhere around the bottom surface of the semiconductor material, including in an evenly distributed regular array. Additional silver pads may be positioned around the edges of the semiconductor material, thereby ensuring a secure contact.

For this embodiment, since the bottom surface of the semiconductor material will not be exposed to light, constraints relating to shading can be relaxed compared to the requirements of the top surface. Thus, opening sizes and segment widths of the expanded metal article can be larger for this embodiment and the percent open area can be less. For example, the resulting photovoltaic cell of this embodiment has a percent open area greater than about 80%, such as greater than about 85%, or such as greater than about 90%.

Figure 2:
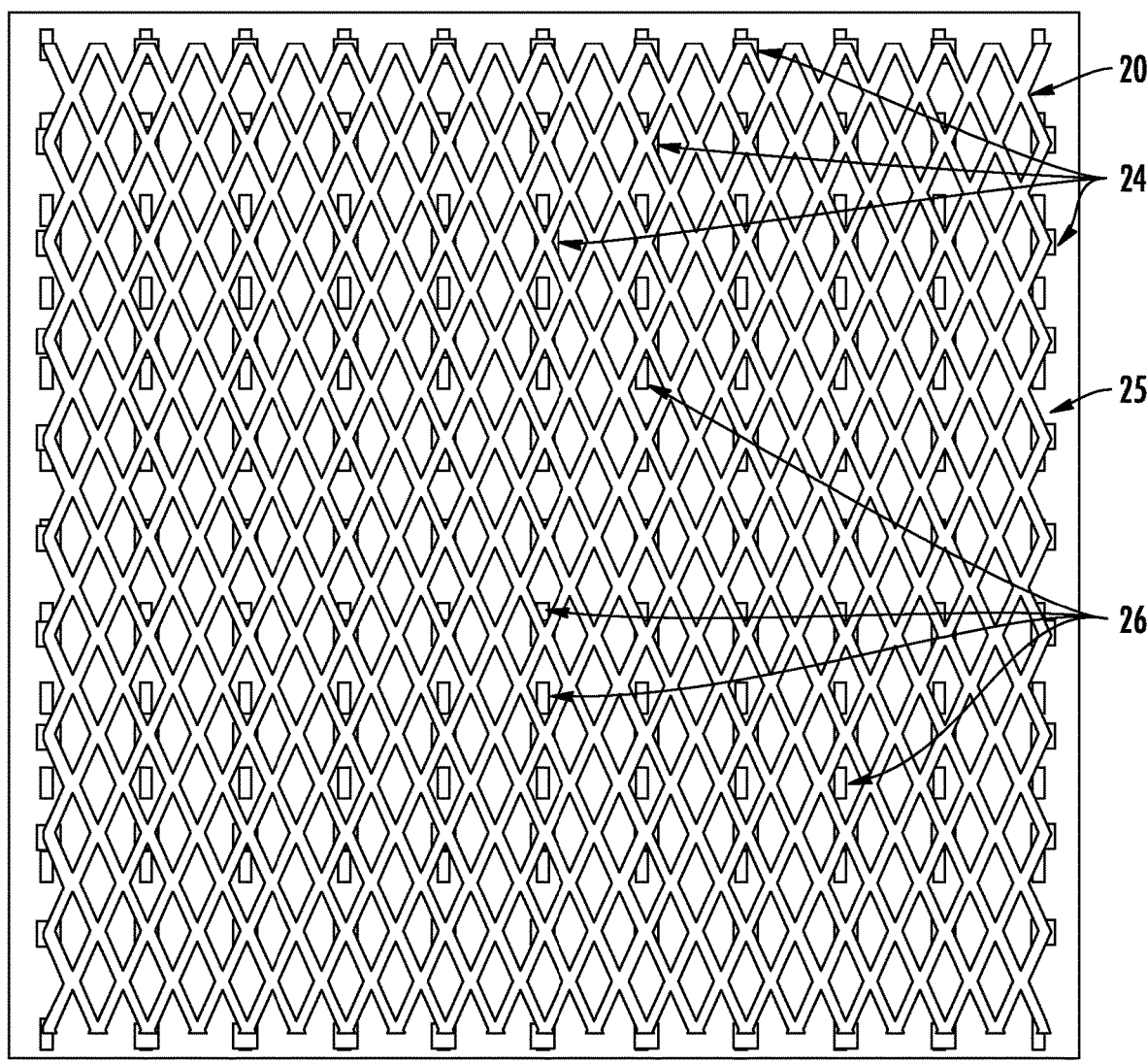
FIG. 2 shows a top view of a formed photovoltaic cell, in accordance with some embodiments.
Figure 3:
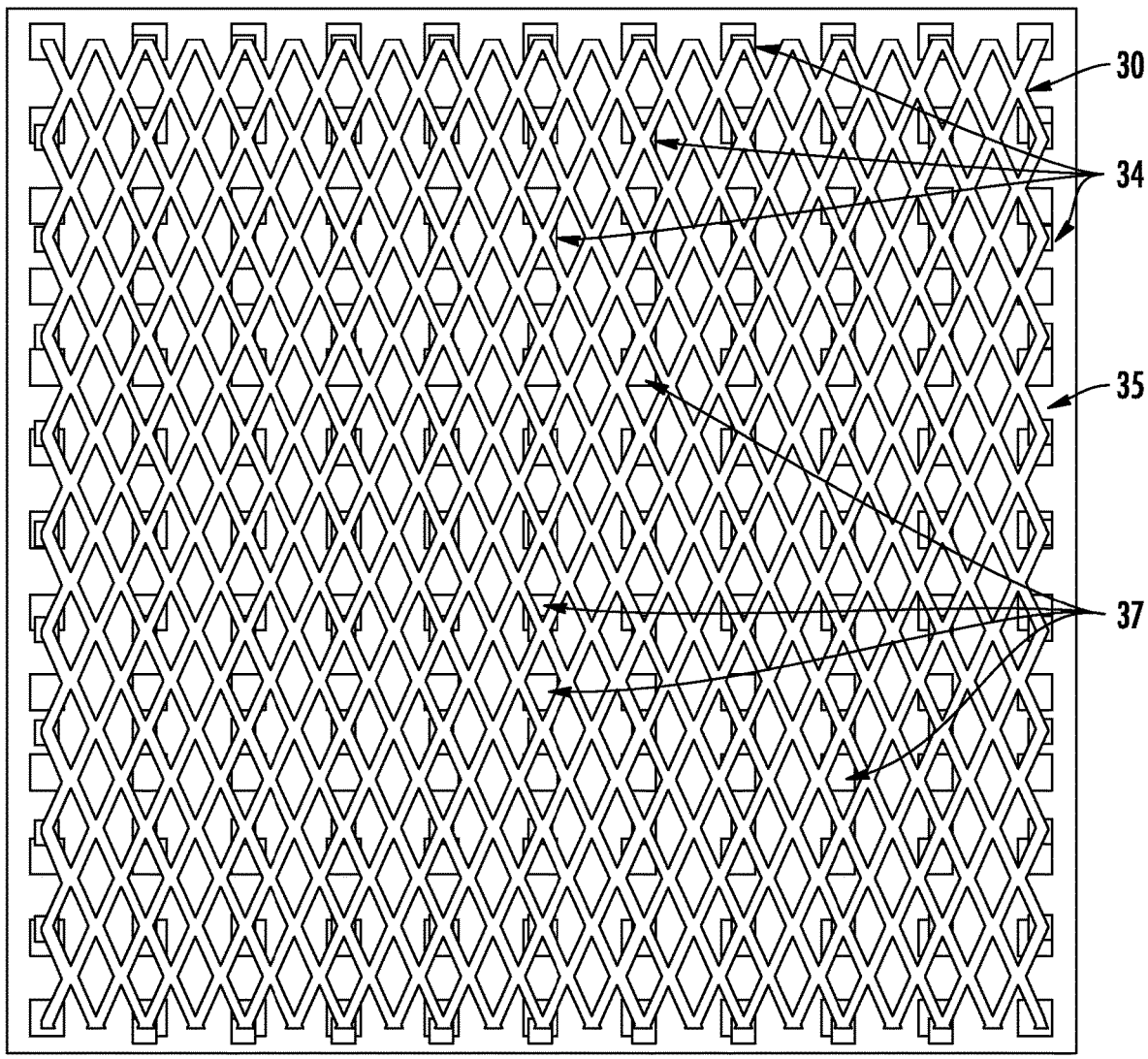
FIG. 3 shows a bottom view of an embodiment of a formed photovoltaic cell, in accordance with some embodiments.

Specific examples of the resulting photovoltaic cells produced in the method of the present disclosure are shown in FIG. 2 and FIG. 3. Thus, in FIG. 2, expanded metal article 20, comprising a plurality of solder pads 24, is shown electrically coupled to the top surface of semiconductor material 25, which comprises a plurality of silver segments 26. Also, in FIG. 3, expanded metal article 30, comprising a plurality of solder pads 34, is shown electrically coupled to the bottom surface of semiconductor material 35, comprising a plurality of square silver pads 37. As can be seen in FIGS. 2 and 3, a majority of solder pads 24 and 34 are in electrical contact with silver segments 26 or silver pads 37, respectively, where the locations of electrical contact are soldering locations at which the expanded metal article 20 or 30 are electrically coupled to the semiconductor material 25 or 35.

As discussed above, one or both surfaces of the semiconductor material may be electrically coupled with the expanded metal article. If only one surface is used, the other surface can be coupled using any known method to complete the circuit in the photovoltaic cell. For example, in the present methods, a free-standing metallic article that differs from the expanded metal article, can be electrically coupled to the available semiconductor surface to form the photovoltaic cell. In particular, a metallic article comprising a plurality of electroformed elements interconnected to form a unitary, free-standing piece comprising gridlines can be used, such as those described in U.S. Pat. Nos. 8,569,096 and 8,936,709. In some embodiments, the electroformed metallic article can be used as a front metallic article on the front, light-incident surface of a photovoltaic cell, while the expanded metal article may be used on the back surface. The electroformed elements of the front metallic article may also include a cell-to-cell interconnect that is integral with the continuous grid and is coupled to a neighboring back surface of a neighboring photovoltaic cell, as described in U.S. Pat. No. 8,936,709 and U.S. patent application Ser. Nos. 15/192,576 and 16/030,766 which are owned by the assignee of the present disclosure and are hereby incorporated by reference.

Figure 4A:
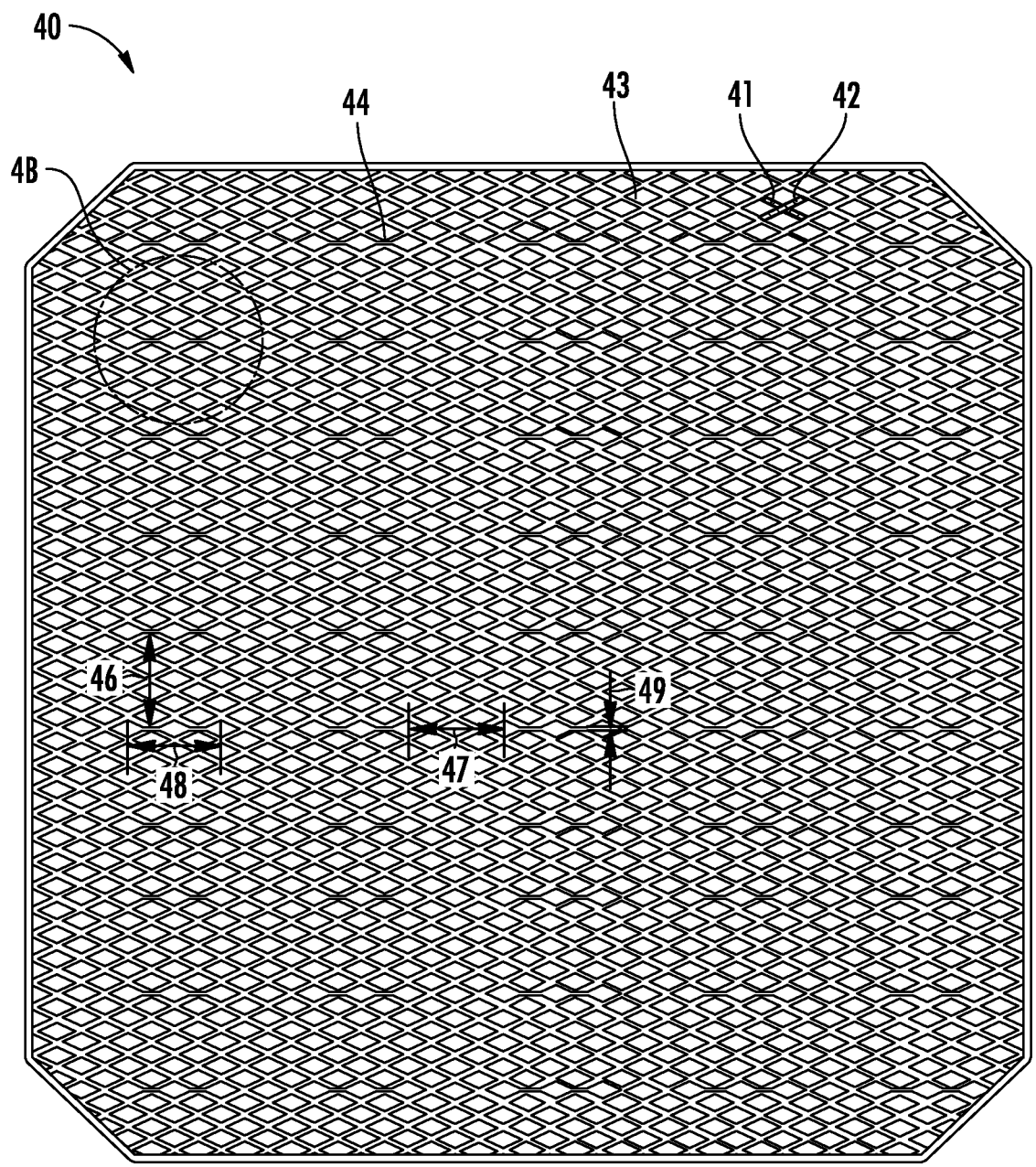
FIG. 4A is a plan view of an expanded metal article with cuts to accommodate thermal expansion, in accordance with some embodiments.
Figure 4B:
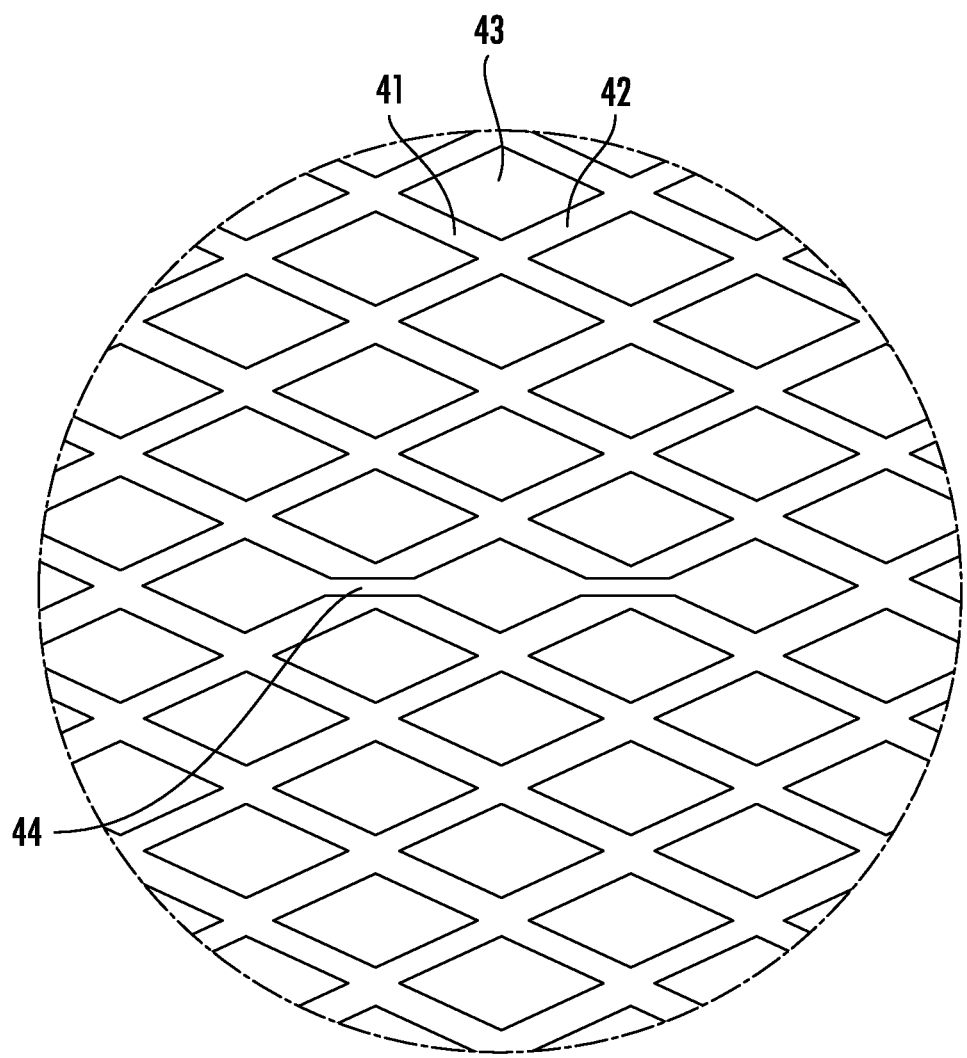
FIG. 4B is a detailed view of FIG. 4A.

FIGS. 4A-4B illustrate further embodiments in which the expanded metal articles of the present disclosure include a plurality of cuts to accommodate a difference in coefficient of thermal expansion between the expanded metal article and the semiconductor material. FIG. 4A is a full view of an expanded metal article 40, while FIG. 4B is a detailed view. The expanded metal article 40 has a plurality of intersecting first segments 41 and a plurality of second segments 42 that form a plurality of openings 43 as described above for previous embodiments. The metal article 40 also has a plurality of cuts 44 that form discontinuities in the grid, where each cut 44 extends across at least one of the first segments 41, one of the second segments 42, and/or an intersection of one of the first segments 41 and one of the second segments 42. In the metal article 40 of FIGS. 4A-4B, each cut 44 is depicted as extending across two intersections of the first segments 41 and second segments 42; however, other lengths of cuts 44 are possible.

The plurality of cuts 44 allow portions of the metal article 40 to freely expand and contract, and provide mechanical flexion within the metal article 40, thus relieving thermal stresses induced during bonding of the metal article to the semiconductor wafer. In the embodiment of FIGS. 4A-4B, the cuts 44 are arranged as an orthogonal array, with dimensions of the array chosen to accommodate a difference in coefficient of thermal expansion between the expanded metal article and the semiconductor material. For instance, array dimensions may include a lateral spacing 46 of about 10 to 15 mm and a lengthwise spacing 47 (from the end of one cut to the start of the next cut) of about 3-7 mm for a 156 mm by 156 mm photovoltaic cell. Instead of an orthogonal array where the cuts 44 are aligned horizontally and vertically with each other, the array may be a staggered array in which the cuts 44 are diagonally aligned with each other. Other array layouts are also possible, which could include having arrays of cuts 44 only in certain regions of the metal article 40, such as where higher stresses are expected. Furthermore, the cuts 44 need not be arranged in an array, such as being randomly placed across the metal article 40. Array dimensions may be uniform throughout the array, or may be different in certain regions such as near the perimeter of the metal article 40.

The array dimensions also include the dimensions of the cuts 44, where for a 156 mm by 156 mm photovoltaic cell the cuts 44 may have a length 48 ranging from, for example, 3 to 7 mm, and a width 49 ranging from, for example, 0.1 to 1 mm. Note that the endpoints of the lengths 47 and 48 are denoted as being from the center of each opening 43 in this embodiment, although other conventions may be utilized as desired for specifying the dimensions of the cuts 44. The specific geometrical arrangement of the plurality of cuts 44 and dimensions of the array of cuts are chosen based on the specific materials being used for the photovoltaic cell and the temperature ranges to which the materials are anticipated to be exposed. Furthermore, the arrangement of the plurality of cuts described above may also be arranged to relieve thermal stresses induced by a front metallic article on a front surface of the semiconductor material. For example, expansion or contraction of the front metallic article may impart mechanical and/or thermal stresses on the semiconductor material, which may then cause mechanical and/or thermal stresses on the expanded metal article on the back surface of the semiconductor material.

Figure 4C:
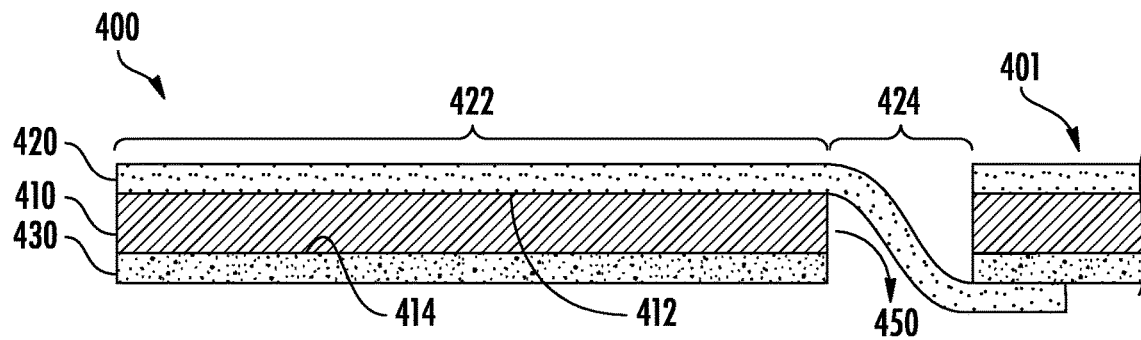
FIG. 4C is a side view of a photovoltaic assembly, in accordance with some embodiments.

In addition to the thermal expansion stresses, the semiconductor material may also experience mechanical stresses imposed by an interconnect and/or a metallic article that serves as an electrical conduit attached to the front (i.e., top) surface of the semiconductor. FIG. 4C shows a simplified side view of an assembled photovoltaic cell 400 (not to scale) which includes a semiconductor material 410 having a front surface 412 and a back surface 414, where the front surface 412 is the light-incident surface of the cell 400. A front metallic article 420—which may be, for example, electroformed—is coupled to the front surface 412 and has a continuous grid 422 that is integrally formed with a cell-to-cell interconnect 424. An expanded metal article 430, such as expanded metal article 40 of FIG. 4A, is coupled to the back surface 414. In a photovoltaic module containing the photovoltaic cell 400, the cell-to-cell interconnect 424 is coupled to a back surface of an adjacent photovoltaic cell 401. The coupling of cells 400 and 401 together in this manner may create mechanical stresses causing the semiconductor wafer 410 to warp or bow as indicated by arrow 450. The specific arrangement of cuts in the expanded metal article 430 on the back (i.e., bottom) surface 414 of the semiconductor material 410 can be chosen to balance out these mechanical stresses, thereby enabling the semiconductor to remain flat. That is, in some embodiments the plurality of cuts is arranged to relieve mechanical stresses induced by the front metallic article 422 on the top surface 412.

Figure 4D:
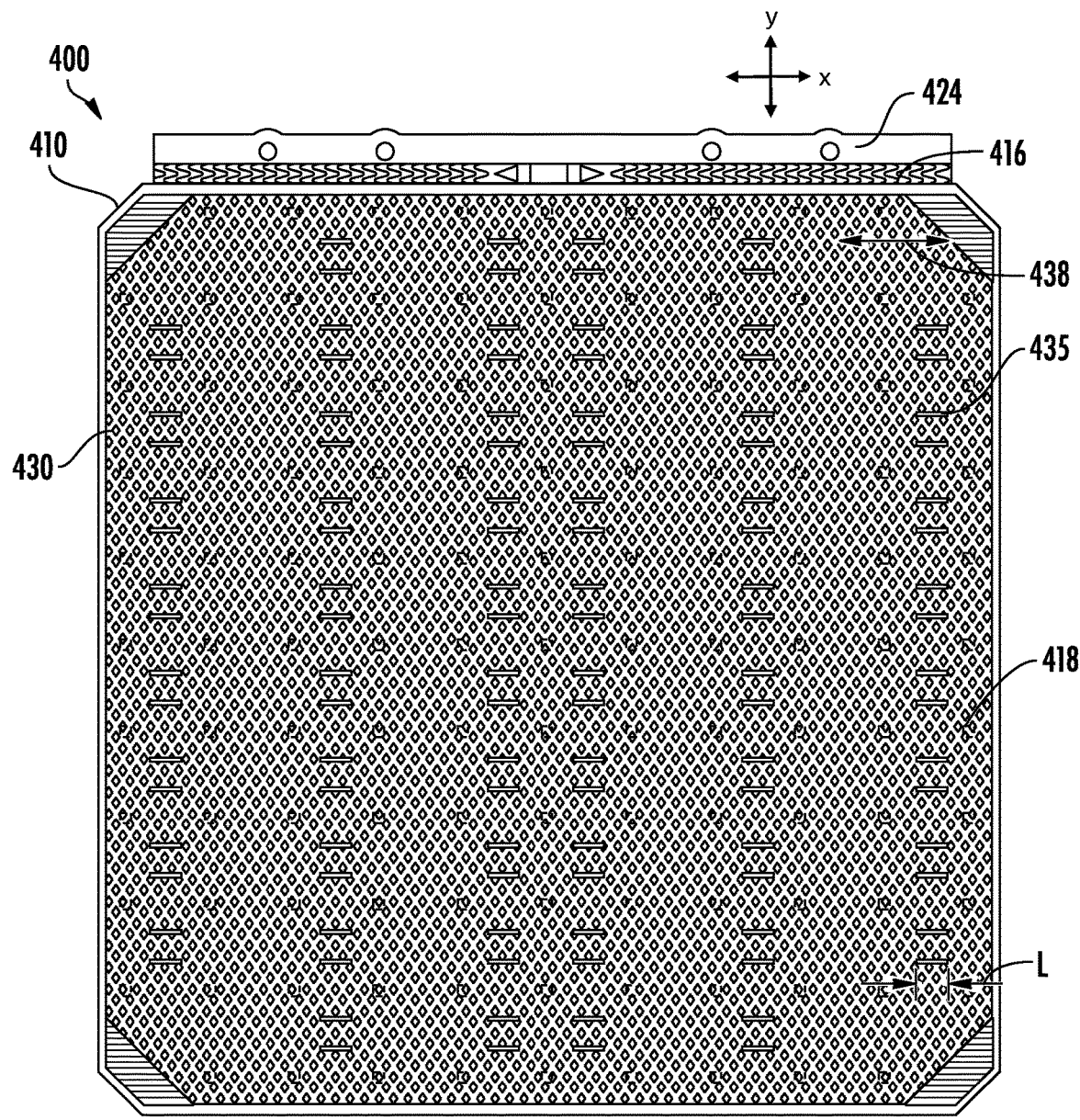
FIG. 4D is a back view of the photovoltaic assembly of FIG. 4C.

FIG. 4D shows an example embodiment of orienting the cuts in the mesh of the expanded metal article relative to the other components to relieve mechanical stresses. In this back view, the expanded metal article 430 is seen, mounted on semiconductor material 410. The cell-to-cell interconnect 424 is seen spanning across and extending beyond a first edge 416 of the front surface 412 of the semiconductor material 410. In FIG. 4D, a plurality of cuts 435 are in the mesh of expanded metal article 430, where the cuts 435 have a length "L" extending in a first direction 438 that is parallel to the first edge 416. This orientation of the cuts 435 enables the expanded metal article 430 to accommodate the mechanical stresses resulting from bowing of the photovoltaic cell in the direction indicated by arrow 450 of FIG. 4C. Arrow 450 represents a bowing of the photovoltaic cell 400 about an axis that is parallel to the first edge 416, which is also approximately parallel to the direction 438 of the cuts 435. In some embodiments, at least one, such as a majority or all of the cuts 435 are oriented to accommodate the mechanical stresses of the bowing or warping of the photovoltaic cell 400 that are caused by the cell-to-cell interconnect 424 being coupled to neighboring photovoltaic cell 401. In other embodiments, some cuts may be oriented to accommodate the bowing while other cuts may be oriented and/or arranged (e.g., positioned and/or dimensioned) for other mechanical stresses and/or thermal stresses. For example, some of the cuts 435 may be positioned between the solder pads 418 (on semiconductor material 410) when the expanded metal article 430 is coupled to the semiconductor wafer 410, to allow for expansion and contraction of the expanded metal article 430 between the fixed solder points 418.

In various embodiments, the number, density, orientation, and location of cuts can vary depending on the location and magnitude of stress to be counter-balanced. For example, the overall number, density, and/or size of the cuts can be increased for instances in which higher stresses are anticipated, such as in aerospace applications due to the extreme environmental conditions. The configuration of the cuts may also depend on the thickness of the semiconductor material being used, as thicker semiconductor materials may experience less bowing or warping and thus may utilize smaller cuts in the expanded metal article than photovoltaic cells that use thinner semiconductor materials. In another example, the direction (i.e., orientation) of the cuts can be arranged according to the direction of the stresses that are to be relieved. Furthermore, as the distribution of stresses imposed on the semiconductor is likely to be spatially asymmetric with respect to the location on the semiconductor, the number, size, orientation, and density of cuts can be tailored to balance out these regional stresses. For example, higher stress can be incurred on the corners and edges of the semiconductor due to geometrical effects. To counter-balance these stresses, a greater density of cuts or larger sized cuts may be placed at the corners and edges of the expanded metal article to give additional stress relief.

In some embodiments, the expanded metal article has an expansion direction in which the plurality of openings was formed (see arrow 15 of FIG. 1), and at least one cut of the plurality of cuts has a length extending in a first direction that is oriented in the expansion direction. In FIG. 4D, for example, the cuts 435 have a length that is oriented across the short way of the openings in the mesh (x-direction in FIG. 4D), which is the expansion direction of the expanded metal article in this embodiment. That is, the plurality of cuts 435 has a length extending in a first direction that is oriented in the expansion direction, and the first direction is oriented in a short way of the plurality of openings (horizontal, x-direction in FIG. 4D). By cutting across the slits that were made to expand the metal sheet, mechanical stresses from the metal trying to rebound back into its original unstretched state can be relieved. Relieving at least some of the mechanical stress that is innate in the expanded metal article due to its forming process also helps prevent the expanded metal article imparting stresses to the semiconductor material (e.g., causing the semiconductor material to bow) when the expanded metal article is coupled to the photovoltaic cell.

Additionally, innate stresses in the expanded metal article from the forming process can be oriented in a different direction from the bowing that is imparted by coupling the cell-to-cell interconnect to a neighboring cell. For example, the expansion direction of the expanded metal article can be oriented in the same direction as the edge along which the cell-to-cell interconnect spans. In this manner, potential warping caused by innate mechanical stresses of the expanded metal article are approximately perpendicular and may reduce or cancel out potential mechanical warping caused by the interconnection between photovoltaic cells.

Figure 5:
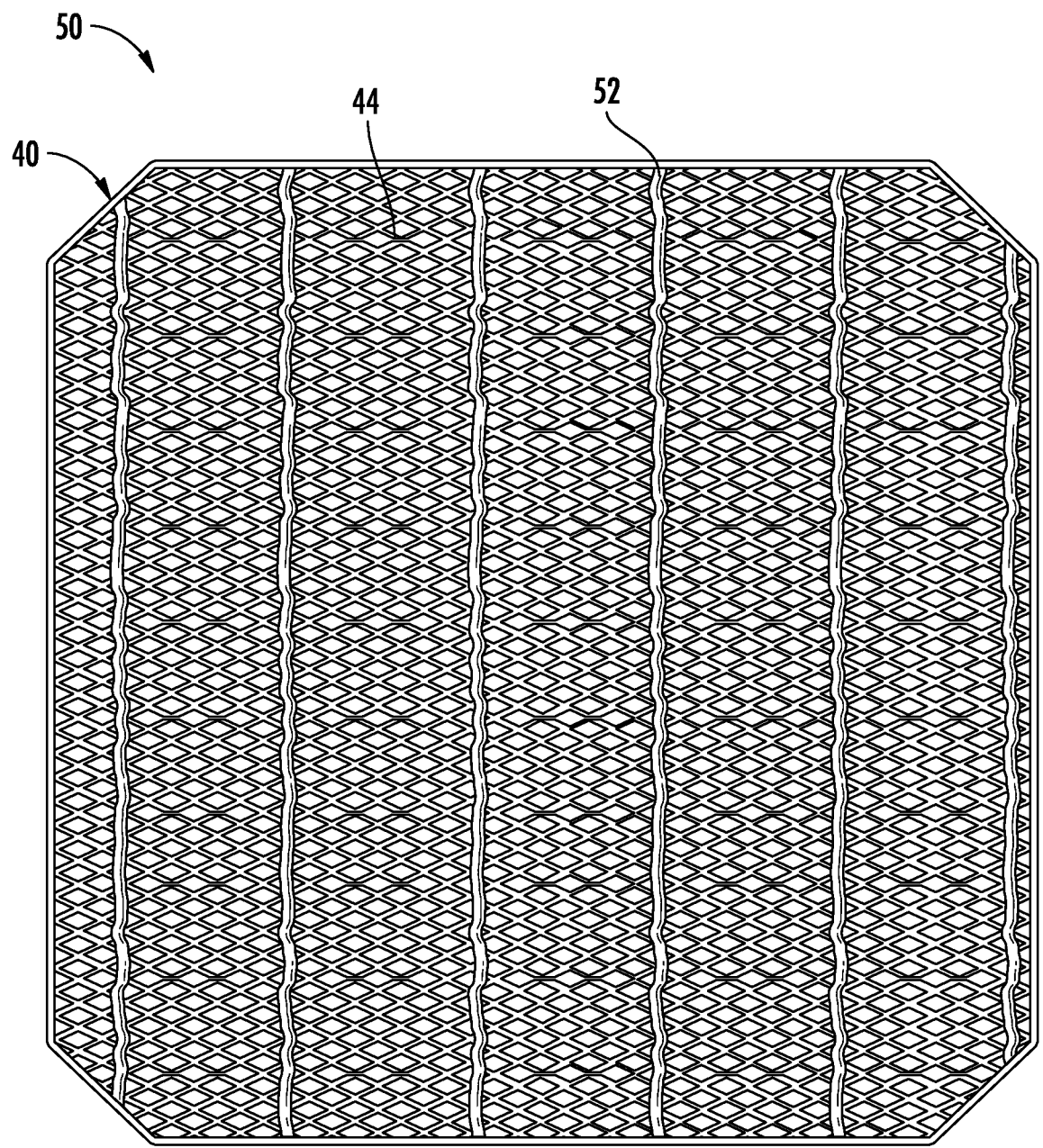
FIG. 5 is a plan view of an example photovoltaic cell onto which an expanded metal article with cuts has been mounted.

FIG. 5 shows a back view of another photovoltaic cell 50 onto which the expanded metal article 40 with cuts 44 has been mounted. A cell-to-cell interconnect of a front metallic article is not included in this view, for clarity. FIG. 5 depicts soldering locations 52, which are linear paths across a length of the photovoltaic cell 50 in this embodiment. At least some of the plurality of cuts 44 are between neighboring soldering locations; that is, being bordered by the nearest two soldering locations 52. For example, in FIG. 5 the cuts 44 are perpendicular to the linear soldering locations 52 and extend across a majority of the distance between the soldering lines. As an example embodiment, for a spacing of about 15 mm between the soldering lines (locations) 52, the cuts may extend approximately 10 to 13 mm across that distance. In other embodiments, the cuts 44 span various portions of the distances between soldering locations, and may be at any orientation with respect to the soldering locations 52, such as parallel, perpendicular, or any angle between. In some embodiments, the cuts 44 do not necessarily need to all be between soldering points (soldering locations 52). However, the cuts 44 that are between soldering locations 52 provide stress relief by allowing the expanded metal article, solder, and the semiconductor wafer to expand and contract relative to each other, compared to the fixed points where the metal article 40 is joined to the photovoltaic cell 50.

Figure 6:
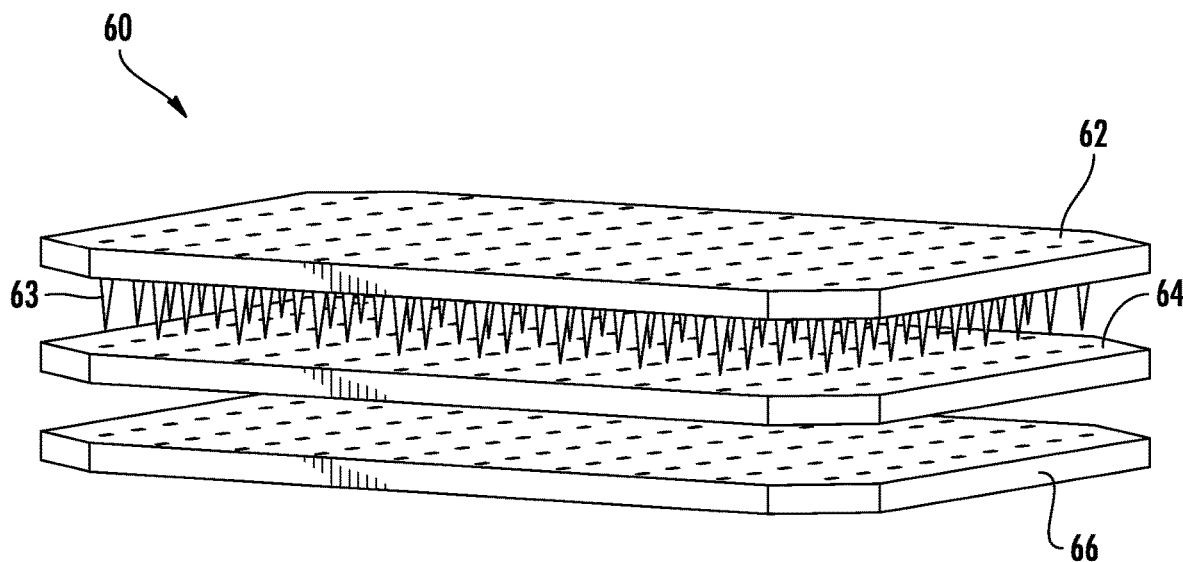
FIG. 6 is a perspective view of a metal cutting assembly, in accordance with some embodiments.

FIG. 6 is a perspective view of an example metal cutting assembly 60 that may be used to create cuts within the expanded metal article. Metal cutting assembly 60 includes a cutting tool 62, a holding plate 64, and a receiving plate 66, where the holding plate 64 is stacked between the cutting tool 62 and the receiving plate 66. Cutting tool 62 has a plurality of cutting elements 63 facing holding plate 64, where the cutting elements 63 serve as knife blades that pierce through the expanded metal article to form cuts (e.g., cuts 44 of FIG. 4). The cutting elements 63 may be made of, for example stainless steel. In operation, the cutting tool 62, holding plate 64, and receiving plate 66 are pressed together, such as by manual or automatic actuation.

Figure 7:
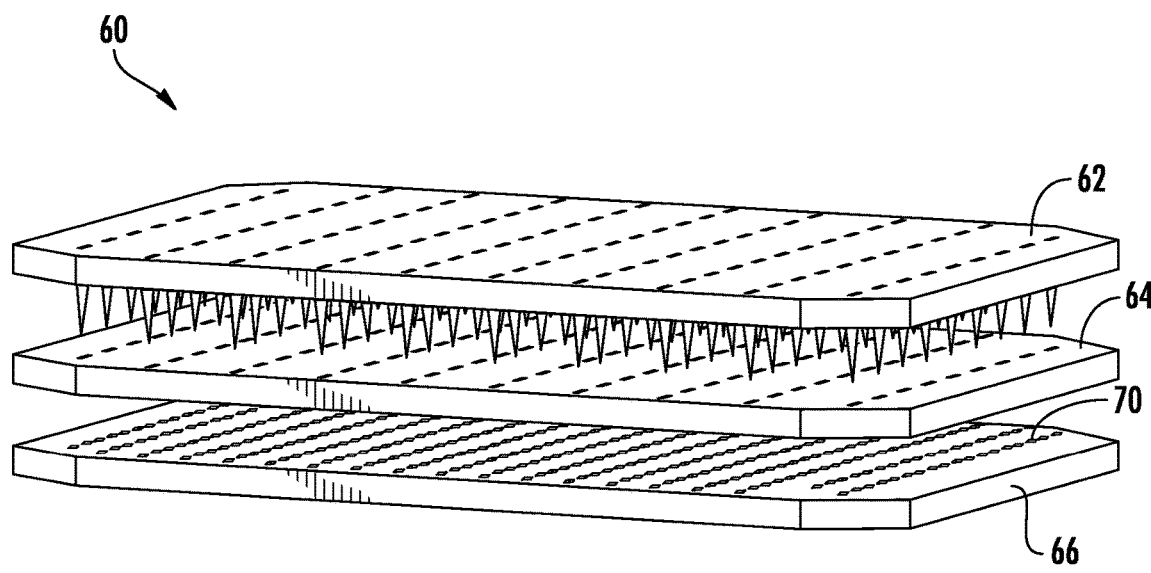
FIG. 7 shows the metal cutting assembly of FIG. 6, with an expanded metal material inserted.
Figure 8:
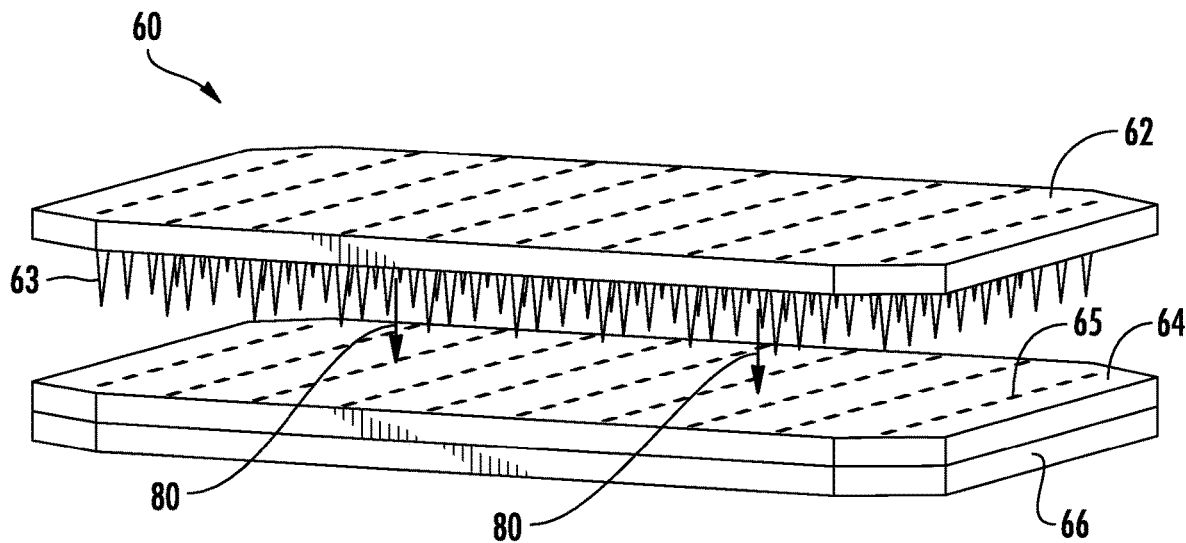
FIG. 8 shows the metal cutting assembly of FIG. 7, with the expanded metal material held between a holding plate and a receiving plate of the assembly.
Figure 9:
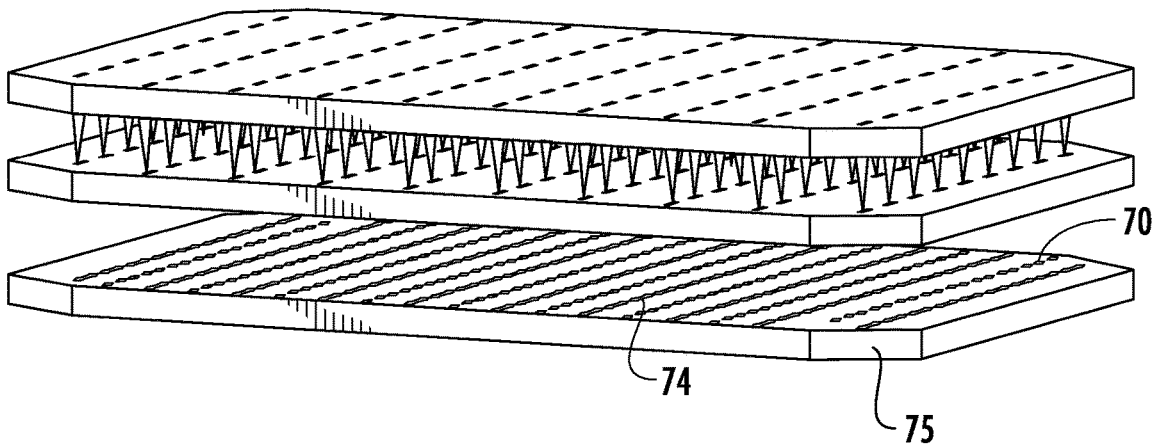
FIG. 9 shows the metal cutting assembly of FIG. 7 after cuts have been created in the expanded metal material.

FIGS. 7-9 show stages of forming the cuts in the expanded metal article using the metal cutting assembly 60. An expanded metal article 70 is provided, such as being supplied from a roll of expanded mesh material, or alternatively supplied as an individual piece. Next, as shown in FIG. 7, an expanded metal article 70 is inserted between the holding plate 64 and the receiving plate 66. In FIG. 8, the holding plate 64 is lowered to hold the expanded metal article 70 between the holding plate 64 and the receiving plate 66. The cutting tool 62 is then lowered as indicated by arrows 80, such that the cutting elements 63 penetrate through the holding plate 64 and the receiving plate 66 and form a plurality of cuts 74 in the expanded metal article 70, as shown in FIG. 9. In some embodiments, the holding plate 64 and receiving plate 66 may be made of a metal such as stainless steel or aluminum, having pre-formed apertures 65 through which the cutting elements 63 can extend. In other embodiments, the holding plate 64 and receiving plate 66 may be made of a material that the cutting elements can pierce, without requiring pre-formed apertures. The cutting tool 62 is then raised while the holding plate 64 remains in place, with the metal article 70 sandwiched between the holding plate 64 and receiving plate 66, to assist in separating the cutting elements 63 from the expanded metal article 70 and to prevent the expanded metal article 70 from deforming as the cutting elements 63 are removed.

In some embodiments, the process can also involve a sizing tool—as part of or as a separate component from the metal cutting assembly 60—to trim the outer perimeter of the expanded metal article 70 to the necessary size and shape for a photovoltaic cell. For example, the length and/or width of the overall expanded metal article can be cut to approximately 156 mm for a 156 mm² photovoltaic cell. If the expanded mesh material for the metal article is supplied from a roll, the roll may be pre-fabricated to 156 mm such that only one end of the mesh material needs to be cut to length. Additionally, for a monocrystalline cell the sizing tool may be configured to create the corners 75 of the pseudosquare shape while the expanded metal article 70 is held in the metal cutting assembly 60.

Figure 10:
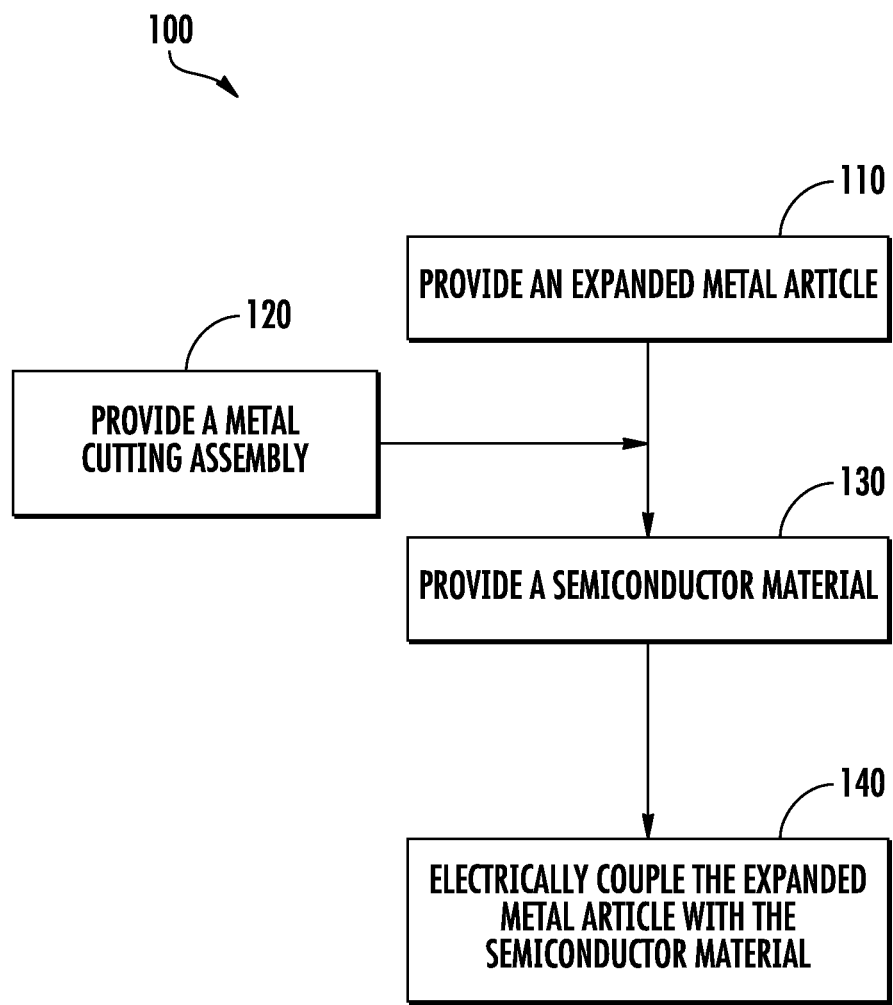
FIG. 10 is a flowchart of methods for forming a photovoltaic cell, in accordance with embodiments of the present disclosure.

FIG. 10 is a flowchart 100 of methods for forming a photovoltaic cell in accordance with embodiments of the present disclosure. In step 110, an expanded metal article is provided, having a plurality of first segments intersecting a plurality of second segments forming a plurality of openings. In some embodiments, the expanded metal article has a surface comprising a plurality of solder pads.

In some embodiments, the expanded metal article has a plurality of cuts, such as created by a metal cutting assembly provided in step 120. Each cut in the plurality of cuts creates a discontinuity in the expanded metal article. That is, the cuts are breaks in the first segments and/or second segments that allow strain within the metal article or within the photovoltaic cell assembly to be relieved. The metal cutting assembly includes a cutting tool, a receiving plate, and a holding plate. The holding plate is stacked between the cutting tool and the receiving plate, and the cutting tool comprises a plurality of cutting elements facing the holding plate. After the expanded metal article is provided in step 110, the expanded metal article is inserted between the holding plate and the receiving plate. The cutting tool is moved toward the holding plate and the receiving plate, as described in FIGS. 6-9, such that the plurality of cutting elements penetrates through the holding plate and the receiving plate and forms a plurality of cuts in the expanded metal article.

In step 130, a semiconductor material is provided, where the semiconductor material has a top surface that serves as a light-incident surface of the photovoltaic cell, and a bottom surface opposite the top surface. In step 140, the expanded metal article is electrically coupled with the semiconductor material at a plurality of soldering locations. For example, the expanded metal article is electrically coupled to a plurality of silver pads on the bottom surface of the semiconductor material. In embodiments in which the expanded metal article is provided with solder pads, a majority of the plurality of solder pads on the surface of the expanded metal article is electrically coupled with the plurality of silver pads on the bottom surface of the semiconductor material at a plurality of soldering locations. In some embodiments, the expanded metal article has a solder coating, and the electrical coupling of step 140 involves soldering the expanded metal article to the plurality of silver pads with an applied solder that is placed onto the solder coating.

In embodiments in which the expanded metal article has cuts for thermal or mechanical relief, at least one cut in the plurality of cuts is within a region between neighboring soldering locations of the plurality of soldering locations. The plurality of cuts, can be arranged as an array having array dimensions configured to accommodate a difference in coefficient of thermal expansion between the expanded metal article and the semiconductor material.

Figure 11:
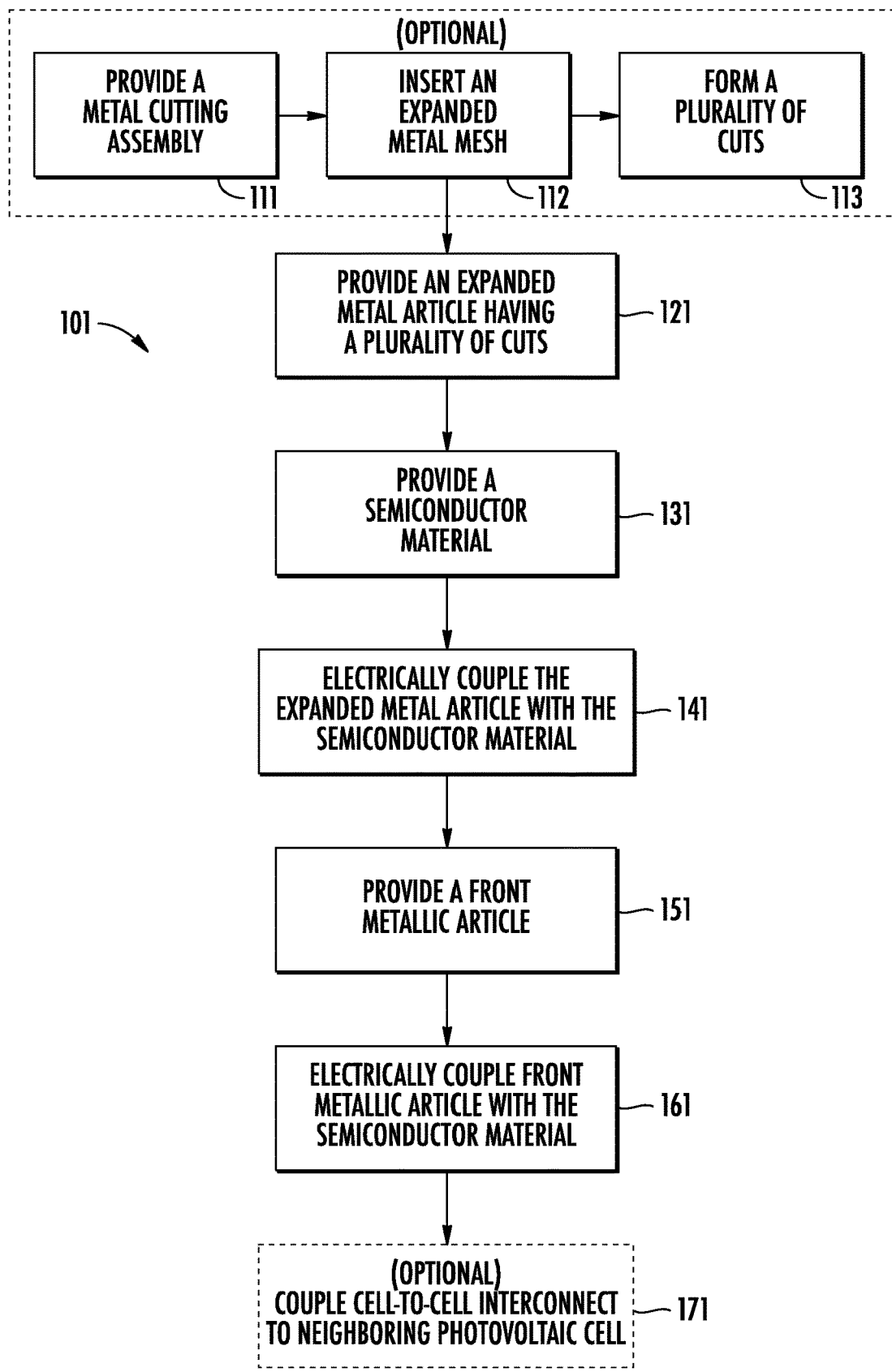
FIG. 11 is a flowchart of further methods for forming a photovoltaic cell, in accordance with embodiments of the present disclosure.

FIG. 11 is a flowchart 101 of methods for forming a photovoltaic cell in accordance with embodiments of the present disclosure, where a plurality of cuts in an expanded metal article are arranged to relieve stresses. In some embodiments, the methods optionally include forming the plurality of cuts in steps 111-113, prior to step 121. Step 111 involves providing a metal cutting assembly, the metal cutting assembly comprising a cutting tool, a receiving plate, and a holding plate. The holding plate is stacked between the cutting tool and the receiving plate, where the cutting tool comprises a plurality of cutting elements facing the holding plate. Step 112 involves inserting an expanded metal mesh (sheet metal having openings formed into a mesh configuration, but no cuts in the mesh) between the holding plate and the receiving plate. Step 113 involves moving the cutting tool toward the holding plate and the receiving plate such that the plurality of cutting elements penetrates through the holding plate, the expanded metal mesh and the receiving plate, resulting in the plurality of cuts being formed in the expanded metal article.

Step 121 involves providing the expanded metal article configured as a mesh. The mesh has a plurality of first segments intersecting a plurality of second segments thereby forming a plurality of openings. The expanded metal article has a plurality of cuts in the mesh, and the expanded metal article has a surface comprising a plurality of solder pads. In step 131 a semiconductor material is provided, the semiconductor material having a back surface comprising a plurality of silver pads. A front surface of the semiconductor material serves as a light-incident surface of the photovoltaic cell. Step 141 involves electrically coupling, at a plurality of soldering locations, a majority of the plurality of solder pads on the surface of the expanded metal article with the plurality of silver pads on the back surface of the semiconductor material. The plurality of cuts of the expanded metal article is arranged on the photovoltaic cell to relieve stresses induced by the front metallic article on the front surface of the semiconductor material. In step 151, a front metallic article is provided. The front metallic article has a plurality of electroformed elements interconnected to form a unitary, free-standing piece comprising a continuous grid. In step 161 the continuous grid of the front metallic article is electrically coupled with the front surface of the semiconductor material.

In some embodiments, the plurality of electroformed elements of the metallic article further comprises a cell-to-cell interconnect that is integral with the continuous grid, and the method further comprises step 171 of coupling the cell-to-cell interconnect to a neighboring back surface of a neighboring photovoltaic cell. The plurality of cuts of the expanded metal article is arranged relative to the photovoltaic cell to relieve mechanical stresses induced by the coupling of the metallic article to the neighboring photovoltaic cell. That is, the expanded metal article is positioned on the photovoltaic cell such that the cuts have a specific orientation in relation to other components of the cell—such as the cell-to-cell interconnect and/or to the expansion direction of the expanded metal article itself. For example, in certain embodiments of step 171, the cell-to-cell interconnect spans across and extends beyond a first edge of the semiconductor material; at least one cut of the plurality of cuts has a length extending in a first direction; and the expanded metal article is oriented such that the first direction is parallel to the first edge. In some embodiments, the expanded metal article has an expansion direction in which the plurality of openings was formed, and at least one cut of the plurality of cuts has a length extending in a first direction that is oriented in the expansion direction.

The present disclosure further relates to photovoltaic cells produced by the methods described above. The photovoltaic cell comprises an expanded metal article electrically coupled to a surface of a semiconductor material. The expanded metal article comprises a plurality of first segments intersecting a plurality of second segments forming an opening and further comprises a plurality of soldering points, such as solder pads, and the semiconductor material comprises a plurality of points of contact for the expanded metal article. The expanded metal article and semiconductor material can be any of those described above. In one embodiment, the semiconductor material has a top or light incident surface comprising a plurality of silver segments, such as silver fingers, and a majority of the plurality of solder pads on the surface of the expanded metal article is in electrical contact with the plurality of silver segments on the semiconductor material. In a second embodiment, the semiconductor material has a bottom or non-light incident surface comprising a plurality of silver pads, and a majority of the plurality of solder pads on the surface of the expanded metal article is in electrical contact with the plurality of silver segments on the semiconductor material.

In certain embodiments of photovoltaic cells of the present disclosure, an expanded metal article comprises a plurality of first segments intersecting a plurality of second segments forming a plurality of openings. The expanded metal article further comprises a plurality of cuts, each cut in the plurality of cuts extending across an intersection of one of the first segments and one of the second segments. A semiconductor material has a bottom surface comprising a plurality of silver pads, where a top surface of the semiconductor material serves as a light-incident surface of the photovoltaic cell. The expanded metal article is electrically coupled at a plurality of soldering locations to the plurality of silver pads on the surface of the semiconductor material. A free-standing metallic article is electrically coupled with the top surface of the semiconductor material to form the photovoltaic cell.

Various combinations and embodiments described above relating to the methods of the present disclosure can also relate to the photovoltaic cells of the present disclosure. The resulting cells can be coupled to form photovoltaic modules.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method for forming a photovoltaic cell, the method comprising:
   a) providing an expanded metal article configured as a mesh, the mesh comprising a plurality of first segments intersecting a plurality of second segments thereby forming a plurality of openings, wherein the expanded metal article has a plurality of cuts in the mesh, and wherein the expanded metal article has a surface comprising a plurality of solder pads;
   b) providing a semiconductor material having a back surface comprising a plurality of silver pads, wherein a front surface of the semiconductor material serves as a light-incident surface of the photovoltaic cell;
   c) electrically coupling, at a plurality of soldering locations, a majority of the plurality of solder pads on the surface of the expanded metal article with the plurality of silver pads on the back surface of the semiconductor material;
   d) providing a front metallic article comprising a plurality of electroformed elements interconnected to form a unitary, free-standing piece comprising a continuous grid; and
   e) electrically coupling the continuous grid of the front metallic article with the front surface of the semiconductor material;
   wherein the plurality of cuts of the expanded metal article is arranged on the photovoltaic cell to relieve stresses induced by the front metallic article on the front surface of the semiconductor material.

2. The method of claim 1 wherein:
   the plurality of electroformed elements of the metallic article further comprises a cell-to-cell interconnect that is integral with the continuous grid;
   the method further comprises e) coupling the cell-to-cell interconnect to a neighboring back surface of a neighboring photovoltaic cell; and
   wherein the plurality of cuts of the expanded metal article is arranged to relieve mechanical stresses induced by the coupling of the metallic article to the neighboring photovoltaic cell.

3. The method of claim 2 wherein:
   the cell-to-cell interconnect spans across and extends beyond a first edge of the semiconductor material;
   at least one cut of the plurality of cuts has a length extending in a first direction; and
   the expanded metal article is oriented such that the first direction is parallel to the first edge.

4. The method of claim 1 wherein:
   the expanded metal article has an expansion direction in which the plurality of openings was formed; and
   at least one cut of the plurality of cuts has a length extending in a first direction that is oriented in the expansion direction.

5. The method of claim 4, wherein the first direction is oriented in a short way of the plurality of openings.

6. The method of claim 1, wherein at least one cut in the plurality of cuts is within a region between neighboring soldering locations of the plurality of soldering locations.

7. The method of claim 1, wherein each cut in the plurality of cuts creates a discontinuity in the expanded metal article.

8. The method of claim 1, wherein the plurality of cuts is arranged as an array having array dimensions configured to accommodate a difference in coefficient of thermal expansion between the expanded metal article and the semiconductor material.

9. The method of claim 1, wherein the expanded metal article spans the back surface of the semiconductor material.

10. The method of claim 1, wherein each opening in the plurality of openings is diamond shaped, each opening having a width from 3 mm to 7 mm, and a length from 10 mm to 15 mm.

11. The method of claim 1, wherein each of the first segments and each of the second segments have a width from 1 mm to 5 mm.

12. The method of claim 1, wherein the expanded metal article has a thickness from 75 microns to 150 microns.

13. The method of claim 1, wherein the photovoltaic cell has a percent open area greater than 80%.

14. The method of claim 1, further comprising prior to step (a):
- a1) providing a metal cutting assembly, the metal cutting assembly comprising a cutting tool, a receiving plate, and a holding plate, the holding plate stacked between the cutting tool and the receiving plate, wherein the cutting tool comprises a plurality of cutting elements facing the holding plate;
- a2) inserting an expanded metal mesh between the holding plate and the receiving plate; and
- a3) moving the cutting tool toward the holding plate and the receiving plate such that the plurality of cutting elements penetrates through the holding plate, the expanded metal mesh and the receiving plate and forms the plurality of cuts in the expanded metal article.

\* \* \* \* \*